US007011733B2

(12) United States Patent
Sandhu (10) Patent No.: US 7,011,733 B2
(45) Date of Patent: *Mar. 14, 2006

(54) METHOD AND APPARATUS FOR DEPOSITING FILMS

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/858,307

(22) Filed: Jun. 1, 2004

(65) Prior Publication Data

US 2004/0216993 A1    Nov. 4, 2004

Related U.S. Application Data

(63) Continuation of application No. 09/384,740, filed on Aug. 27, 1999, now Pat. No. 6,752,912, which is a continuation-in-part of application No. 08/631,465, filed on Apr. 12, 1996, now Pat. No. 6,827,824.

(51) Int. Cl.
  *C23C 14/34*    (2006.01)
  *C23C 16/00*    (2006.01)
(52) U.S. Cl. ............................ 204/192.15; 204/192.12; 204/192.17; 204/298.06; 204/298.11; 204/298.16; 204/298.26
(58) Field of Classification Search ........... 204/192.12, 204/192.15, 192.17, 298.06, 298.11, 298.16, 204/298.26; 118/723 R, 723 VE, 723 MP, 118/723 E, 723 ER; 427/586, 595, 596, 427/597, 248.1, 250

See application file for complete search history.

(56) References Cited

U.S. PATENT DOCUMENTS

| 3,583,361 | A | 6/1971 | Laudel ..................... 118/49.5 |
| 3,962,988 | A | 6/1976 | Murayama et al. ......... 118/49.1 |
| 4,059,761 | A | 11/1977 | Dawson ...................... 250/287 |
| 4,123,316 | A | 10/1978 | Tsuchimoto ................ 156/643 |
| 4,579,750 | A | 4/1986 | Bowen et al. ............. 427/53.1 |
| 4,676,194 | A | 6/1987 | Satou et al. ................ 118/720 |
| 4,901,667 | A | 2/1990 | Suzuki et al. ............... 118/719 |
| 4,925,542 | A | 5/1990 | Kidd ..................... 204/192.31 |
| 4,981,568 | A | 1/1991 | Taranko et al. ........ 204/192.31 |
| 5,089,442 | A | 2/1992 | Olmer ....................... 432/235 |
| 5,100,526 | A | 3/1992 | Ito ......................... 204/298.05 |
| 5,110,435 | A | 5/1992 | Haberland ............. 204/192.31 |
| 5,117,432 | A | 5/1992 | Nilsen ........................... 372/5 |
| 5,128,173 | A | 7/1992 | Kugan ......................... 427/38 |

(Continued)

FOREIGN PATENT DOCUMENTS

EP    0288608 A1    11/1988

(Continued)

OTHER PUBLICATIONS

Shiraishi translation. JP 05-311419.*

*Primary Examiner*—Rodney G. McDonald
(74) *Attorney, Agent, or Firm*—Fletcher Yoder PC (57) ABSTRACT

In a sputtering apparatus, target particles to be deposited onto a substrate are selectively ionized relative to other particles in the deposition chamber. For example, titanium or titanium-containing target particles are selectively ionized, while inert particles, such as argon atoms, remain substantially unaffected. Advantageously, one or more optical ionizers, such as lasers, are used to create one or more ionization zones within the deposition chamber in which such selective ionization takes place.

40 Claims, 6 Drawing Sheets

U.S. PATENT DOCUMENTS

| | | | |
|---|---|---|---|
| 5,178,739 A | 1/1993 | Barnes et al. | 204/192.12 |
| 5,180,918 A | 1/1993 | Isobe | 250/492.2 |
| 5,188,671 A | 2/1993 | Zinck et al. | 118/715 |
| 5,205,870 A | 4/1993 | Sato et al. | 118/722 |
| 5,290,358 A | 3/1994 | Rubloff et al. | 118/715 |
| 5,302,266 A | 4/1994 | Grabarz et al. | 204/192.12 |
| 5,382,457 A | 1/1995 | Coombe | 427/596 |
| 5,431,799 A | 7/1995 | Mosley et al. | 204/298.06 |
| 6,752,912 B1 * | 6/2004 | Sandhu | 204/192.15 |
| 6,827,824 B1 * | 12/2004 | Blalock et al. | 204/192.12 |

FOREIGN PATENT DOCUMENTS

| | | | |
|---|---|---|---|
| EP | 0418091 A2 | | 3/1991 |
| JP | 63-203767 | | 8/1988 |
| JP | 5-255859 | | 10/1993 |
| JP | 05-311419 | * | 11/1993 |
| JP | 5-311419 | | 11/1993 |

* cited by examiner

METHOD AND APPARATUS FOR DEPOSITING FILMS

CROSS-REFERENCE TO RELATED APPLICATIONS

This application is a continuation of U.S. application Ser. No. 09/384,470, filed Aug. 27, 1999 now U.S. Pat. 6,752,912, which is a continuation-in-part of U.S. application Ser. No. 08/631,465, field Apr. 12, 1996 now U.S. Pat. 6,827,824.

BACKGROUND OF THE INVENTION

1. Field of the Invention

The present invention relates generally to the field of integrated circuit manufacturing technology and, more particularly, to a method for depositing selected target atoms.

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the manufacturing of integrated circuits, numerous microelectronic circuits are simultaneously manufactured on semiconductor substrates. These substrates are usually referred to as wafers. A typical wafer is comprised of a number of different regions, known as die regions. When fabrication is complete, the wafer is cut along these die regions to form individual die. Each die contains at least one microelectronic circuit, which is typically packaged and combined with other circuits to form a desired electronic device, such as a computer. Examples of microelectronic circuits which can be fabricated in this way include a microprocessor and a memory, such as a dynamic random access memory ("DRAM").

Although referred to as semiconductor devices, integrated circuits are in fact fabricated from numerous materials of varying electrical properties. These materials include insulators or dielectrics, such as silicon dioxide, and conductors, such as aluminum or tungsten, in addition to semiconductors, such as silicon and germanium. These various materials are fabricated and arranged on the wafer to form electrical circuits.

For instance, in the manufacture of integrated circuits, conductive paths are formed to connect different circuit elements that have been fabricated within a die. Such connections are typically formed within structures, such as trenches or holes. For example, conductive lines may be fabricated by depositing conductive material within trenches, and contacts or interconnections may be fabricated by depositing conductive material within openings in intermediate insulative layers. These openings are typically referred to as "contact openings" or "vias." A contact opening is usually created to expose an active region, commonly referred to as a doped region, while vias traditionally refer to any conductive path between any two or more layers in a semiconductor device.

After a contact opening, for instance, has been formed to expose an active region of the semiconductor substrate, an enhanced doping may be performed through the opening to create a localized region of increased carrier density within the bulk substrate. This enhanced region provides a better electrical connection with the conductive material which is subsequently deposited within the opening. One method of increasing conductivity further involves the deposition of a thin titanium-containing film, such as titanium silicide, over the wafer so that it covers the enhanced region at the bottom of the contact opening prior to deposition of the conductive layer. Once the bottom of the contact opening has been lined with a thin titanium-containing film, it is usually desirable to fill the contact opening with a conductive material, such as titanium, to complete the formation of the contact.

Of course, it should also be noted that thin films of titanium-containing compounds find other uses as well in the fabrication of integrated circuits. For example, titanium nitride is used as a diffusion barrier to prevent chemical attack of the substrate, as well as to provide a good adhesive surface for the subsequent deposition of tungsten. Indeed, many reasons exist for depositing thin films between adjacent layers in a semiconductor device. For example, thin films may be used to prevent interdiffusion between adjacent layers or to increase adhesion between adjacent layers. Titanium nitride, titanium silicide, and metallic titanium are known in the art as materials that can be deposited as thin films to facilitate adhesion and to reduce interdiffusion between the layers of a semiconductor device. Other films that may be useful for these purposes also include titanium tungsten, tantalum nitride, and the ternary alloy composed of titanium, aluminum, and nitrogen.

The deposition of titanium and titanium-containing material is just one example of a step in the manufacture of semiconductor wafers. Indeed, any number of thin films, insulators, semiconductors, and conductors may be deposited onto a wafer to fabricate an integrated circuit. As the size of the microelectronic circuits, and therefore the size of die regions, decreases, the percentage of reliable circuits produced on any one wafer becomes highly dependent on the ability to deposit these thin films uniformly at the bottom of the trenches and contact openings and to fill the trenches and contact openings with conductive material.

Integrated circuit technology has advanced through continuing improvements in photolithographic processing so that smaller and smaller features can be patterned onto the surface of a substrate. These smaller features not only make the resulting electronic circuits more compact, but they also make the circuits operate at a higher speed. However, as contact structures, such as trenches, contact openings, and vias, are made smaller, they become more difficult to fill.

To begin to appreciate this problem, it should be understood that the lateral dimension of such structures is typically referred to as the "width" and the vertical dimension of such structures is typically referred to as the "depth." The aspect ratio is the ratio of depth to width. Thus, as the features have become smaller, the aspect ratio has risen, resulting in high aspect structures. As discussed above, these high aspect ratio structures usually must be filled with an appropriate material before continued processing. Most often the objective is to provide void-free, and preferably seam-free, filling of such structures. Indeed, many different techniques have been developed in an effort to address this problem. For example, films may be deposited by several different methods, such as spin-on deposition, chemical vapor deposition (CVD), plasma enhanced chemical vapor deposition (PECVD), and physical deposition.

In spin-on deposition, the material to be deposited is mixed with a suitable solvent and spun onto the substrate. The primary disadvantage of spin-on deposition is that nominal uniformity can only be achieved at relatively high thicknesses. Furthermore, this technique often covers high aspect ratio structures without filling them, thus resulting in voids. Therefore, this method is primarily used for the deposition of photoresist and the like, and it is generally not useful for the deposition of thin films or the filling of high aspect ratio structures.

Of the methods mentioned above, it is arguable that CVD and PECVD are best suited to deposit the thinnest films. However, films deposited in this manner tend to exhibit relatively conformal deposition on slanted or vertical surfaces as well as on the bottom surfaces of the trenches and contact openings. While such conformal deposition of thin films certainly finds many uses in the fabrication of integrated circuits, it tends to be somewhat problematic when the goal of a particular process step is to deposit a thin film only at the bottom of a structure or to fill a high aspect ratio structure. Because most deposition techniques of this type inherently deposit material on the sidewalls at the same rate as at the bottom of a contact structure, the sidewall deposition tends to close off the opening of the structure before the structure is completely filled. When the structure is closed off in this manner, a void exists within the structure and a seam exists at the opening. Voids are undesirable in a contact structure because air does not conduct electricity well, and seams are undesirable because solvents and the like which tend to accumulate in the seams can degrade the contact. Thus, chemical vapor deposition techniques are generally only successfully used for moderate aspect ratio structures where sidewall deposition does not close off the structure before it is filled.

In sputter deposition, the material to be deposited, typically referred to as the target, is bombarded with positive inert ions. Once the material exceeds its heat of sublimation, target atoms are ejected into the gas phase where they are subsequently deposited onto the substrate. Sputter deposition has been widely used in integrated circuit processes to deposit titanium-containing films. However, the primary disadvantage of sputter deposition is that high aspect ratio structures are difficult to fill due to "shadowing" effects. Shadowing effects are produced due to the fact that the sputtered particles tend to travel in random or uncontrolled directions, i.e., isotropically, and thus strike the sidewalls of the contact structure at an angle. The particles therefore are deposited on the sidewalls, causing a film growth on the sidewalls. The sidewall film growth eventually closes off the via before it is filled. This problem is often acute in the case of multi-layer metal (MLM) designs where high aspect ratio vias are etched into a dielectric layer and metal must be deposited to fill the via.

To fill a contact structure, it is desirable to deposit films that form preferentially at the bottom of the structure rather than on the sidewalls. Thus, physical deposition techniques, such as sputtering, which produce isotropically traveling particles were traditionally limited for use in filling low aspect ratio structures. However, various techniques for directing sputtered target atoms toward the wafer have been developed in efforts to address the problem of isotropically traveling particles collecting on the sidewalls of the contact structure. For example, collimators have been employed to prevent randomly directed atoms from reaching the surface of the wafer. In collimated sputtering, lattice-shaped collimators block particles traveling towards the wafer at unacceptable angles. Such collimators typically have high aspect ratio tunnels that allow only particles having acceptable trajectories to pass through. The remaining particles impact and deposit on the sidewalls of the collimator, rather than on the sidewalls of the contact structures on the wafer. However, since fewer than 50% of the sputtered particles tend to travel in the shadow angle of $90°+/-5°$, most of the particles deposit onto the collimator rather than on the wafer. Thus, while collimators prevent much of the undesirable build up of particles on the sidewalls of contact structures, they do so at the expense of low deposition rates and a high degree of particulate contamination from the material deposited on the collimator sidewalls. Moreover, collimators provide limited directionality, as the particles leaving the collimator still typically have $\pm 5°$ variation in their trajectories.

In an effort to improve the deposition rate of collimated sputtering, the wafers have been electrically charged to attract charged titanium ions, and complex induction coils have been used to create a magnetic field to enhance the life time of titanium ions. Because these techniques cause the titanium ions to travel in a direction substantially perpendicular to the wafer, they increase the number of sputtered particles that will pass through the collimator for deposition on the wafer. However, these techniques affect all particles in a similar manner. In other words, the charged wafer attracts all ions, not just titanium ions, and the magnetic field enhances the life time of all ions, not just titanium ions. Thus, these techniques will ionize argon particles as well, which bombard and damage the wafer.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided an apparatus for depositing film. The apparatus includes a deposition chamber being to hold inert particles and target particles. An ionizer creates an ionization zone within the deposition chamber. The ionizer ionizes the target particles passing through the ionization zone while leaving the inert particles substantially unaffected.

In accordance another aspect of the present invention, there is provided a method for depositing a film onto a substrate. The method includes the acts of: passing target particles and inert particles through an ionization zone in a deposition chamber to ionize the target particles while leaving the inert particles substantially unaffected; and steering the ionized target particles into a collimated stream directed along a given path toward the substrate.

BRIEF DESCRIPTION OF THE DRAWINGS

The foregoing and other advantages of the invention will become apparent upon reading the following detailed description and upon reference to the drawings in which.

DESCRIPTION OF SPECIFIC EMBODIMENTS

In the interest of clarity, not all features of an actual implementation of an integrated circuit process are described in this specification. This illustration is restricted to those aspects of an integrated circuit process involving the sputter deposition of material, such as titanium and titanium containing films. Conventional details of integrated circuit processes, such as mask generation, resist casting, resist development, etching, doping, cleaning, implantation and annealing are not presented as such details are well known in the art of integrated circuit manufacture.

The methods and apparatus disclosed herein provide collimated streams of particles for film deposition. The particular embodiments are described with reference to a sputtering apparatus, but it should be readily apparent that other film deposition techniques, such as evaporation, E-gun, and CVD, might be adapted in accordance with these teachings.

In the specific examples described below, the sputtering apparatus deposits a metal or a metal-containing film onto the surface of a semiconductor wafer. While this is a common and useful application, it should be understood that the teachings may also apply to the deposition of other types of materials, such as dielectrics, semiconductors, and the like.

As mentioned above, one problem depositing materials using sputtering is that particles typically have an isotropic distribution of trajectories when they are removed or extracted from a source, also called a target. In other words, the particles move away from the target according to a relatively random distribution of trajectories. To provide a collimated stream, the particles must be given longitudinal energy so that they travel straight toward the substrate, or the particles must be otherwise directed toward the substrate.

As described below with reference to the illustrated embodiments, selected particles within the deposition chamber are redirected and given longitudinal energy to create the collimated streams. The several embodiments shown and described herein illustrate various manners in which the basic teachings may be used to enhance sputtering techniques. Other modifications may be apparent to those skilled in the art and may be considered equivalent to the embodiments shown and described herein.

Figure 1:
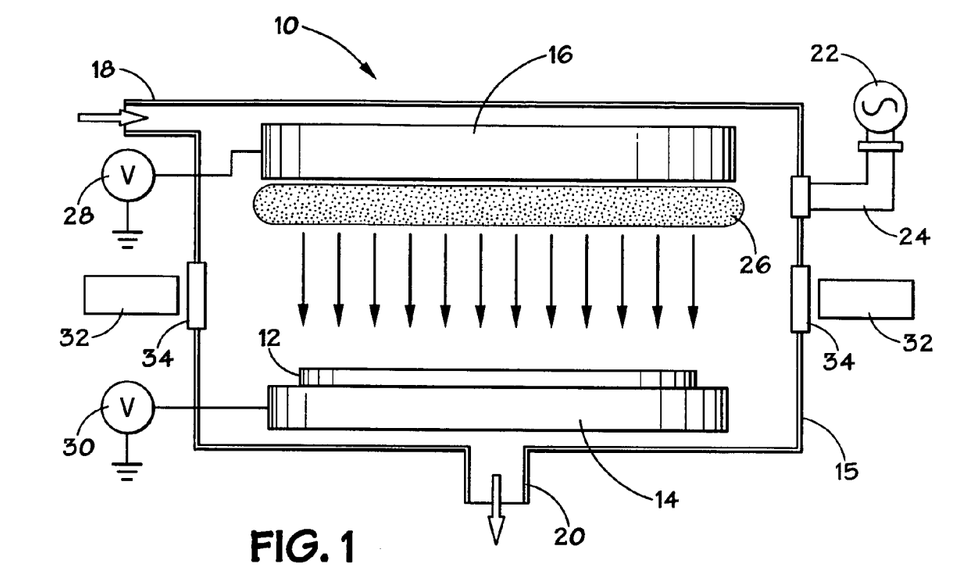
FIG. 1 illustrates a schematic view of a first embodiment of a deposition apparatus in accordance with the present invention.

Turning now to the drawings, and referring initially to FIG. 1, which illustrates a first embodiment of a sputtering apparatus generally designated by the reference numeral 10. The apparatus 10 is shown as a single wafer sputter deposition apparatus. However, the teachings may be readily applied to a multiple wafer sputtering apparatus as well. A substrate 12, such as a semiconductor wafer that may include one or more surface layers and patterned features formed thereon, rests on a support 14 at one end of the deposition chamber 15. A target 16, which includes atoms to be deposited onto the substrate 12, is provided at an opposite end of the deposition chamber 15. Process gasses are supplied via a port 18 and fill the space between the target 16 and the substrate 12. Ordinarily, the apparatus 10 is maintained at a low pressure by a vacuum pump (not shown) coupled to an outlet port 20.

A high frequency or microwave energy source 22 may be coupled to the depositon chamber 15 via a wave guide 24 to supply high frequency energy into a region 26 near the target 16. The application of high frequency energy from the source 22 causes a plasma to be generated in the region 26 by electron cyclotron residence (ECR) heating. The plasma is typically comprised of the process gasses that are ionized by the ECR heating to a very high energy state giving individual ions in the plasma significant kinetic energy. Process gasses provided through the port 18 typically include an inert gas such as argon. However, in a reactive sputtering or CVD system, process gasses would include inert gasses along with components that would react with the materials sputtered from target 16 to create films that deposit on the substrate 12.

The excited argon atoms in plasma strike the surface of the target 16 with energy sufficient to cause atoms on the surface of the target 16 to be ejected into the plasma. Some of the atoms ejected from the target 16 have sufficient energy to travel through the low-pressure environment to the substrate 12 where they deposit to form a film. Other ejected atoms have insufficient energy and are ionized in the plasma. These atoms are often attracted back to the target 16 by a negative bias applied to the target 16 by a voltage supply 28. These atoms return to the target 16 and re-sputter additional atoms from the target 16.

A voltage supply 30 is coupled to the support 14 to provide a large negative bias to the substrate 12 during the sputter deposition. This negative bias creates an electric field between the substrate 12 and the plasma that tends to attract positive ions from the plasma toward the substrate 12. The DC field created by the voltage source 30 only acts upon ionized atoms from the target 16 which at any point in time represent only a portion of the atoms ejected from the target 16. The ionized target atoms in the plasma are thus given some degree of directionality by the bias supply 30 to improve the properties of the deposited film.

However, because the field created by the bias supply 30 only affects ionized target atoms, the improvement in directionality is limited. This is particularly true in the case of metal target particles which recombine quickly as they leave the plasma to form neutral metal particles. Once neutralized, the neutral target atoms in a sputter apparatus are not affected by static electric or magnetic fields and, thus, continue on their original random trajectory. Thus, an important feature of the apparatus 10 is the introduction of a secondary ionizer 32.

The secondary ionizer 32 creates a secondary ionization zone between the plasma in the region 26 and the surface of the substrate 12. The secondary ionizer 32 re-ionizes the target atoms thus allowing them to be accelerated and steered using static electric and/or magnetic fields. In the embodiment shown in FIG. 1, the secondary ionizer 32 advantageously supplies its optical energy through quartz windows 34 in the side of the deposition chamber 15. The static electric field created by the supply 30 will accelerate the ionized target atoms in a direction substantially perpendicular to the surface of the substrate 12 once the target atoms have passed through the secondary ionization zone.

The secondary ionizer 32 provides optical energy having sufficient power and a selected wavelength to ionize selected target atoms or molecules without substantially ionizing unwanted atoms or molecules. In this example, using a titanium target in an inert argon gas, the optical energy advantageously selectively ionizes the titanium atoms without ionizing the argon atoms. Of course, in a reactive sputtering system, the optical energy would advantageously ionize the titanium-containing molecules without ionizing other atoms or molecules. For titanium, the first ionization energy is 658.8 KJ/mol or 6.83 eV, and the equivalent wavelength of electromagnetic waves for this energy is about 177 nm. To provide this type of selective ionization of titanium atoms, the secondary ionizer 32 may be, for example, a $F_2$ excimer laser having a wavelength of approximately 157 nm. As another example, an extreme UV (EUV) laser with recycling Xe having a wavelength of 13.4 nm may be used.

Figure 2:
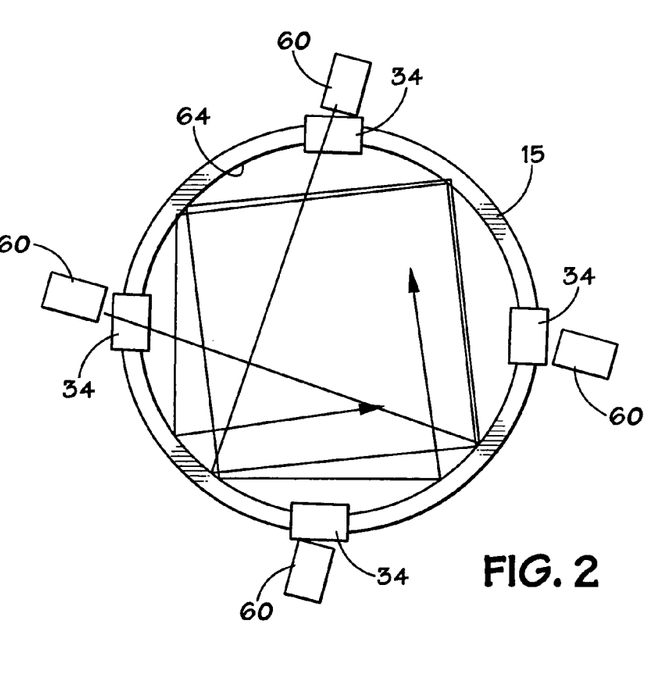
FIG. 2 illustrates a top plan view of the deposition apparatus of FIG. 1.

To describe the operation of the secondary ionizer 32 in further detail, FIG. 2 illustrates a top plan view of the first embodiment. The secondary ionizer 32 advantageously causes the optical energy to interact with a significant number of target atoms in the secondary ionization zone. One method of accomplishing this task is to distribute a plurality of optical sources 60 about the periphery of the deposition chamber 62. The quartz windows 34 allow the optical energy from the sources 60 to enter the deposition chamber 62. Advantageously, a mirrored inner surface 64 is provided in alignment with the path of the optical energy from the sources 60. The mirrored inner surface 64 causes the optical energy to reflect multiple times within the deposition chamber 62 creating a plane of optical energy which interacts continuously with target atoms that intersect the plane of optical energy.

As discussed above, the sources 60 are lasers having a wavelength chosen to ionize the target particles, while leaving other particles relatively unaffected. Suitable lasers may include excimer lasers, tuned dye lasers, or other optical energy sources capable of supplying sufficient power at a desirable wavelength into the deposition chamber 62. Alternatively, the sources 60 may be ultraviolet or visible light sources focused with conventional lenses (not shown) to fill the secondary ionization zones with optical energy. The sources 60 may operate continuously or in pulses depending on the equipment selected.

Although a mirrored inner surface 64 is illustrated in FIG. 2, it is possible to form the quartz windows 34 as lenses which will bend the optical energy from the sources 60 into a plane as it enters the deposition chamber 62. Various optical techniques that create sufficient interaction and spread light from the sources 60 sufficiently to create an ionization zone within the deposition chamber 62 may also be adequate.

Figure 3:
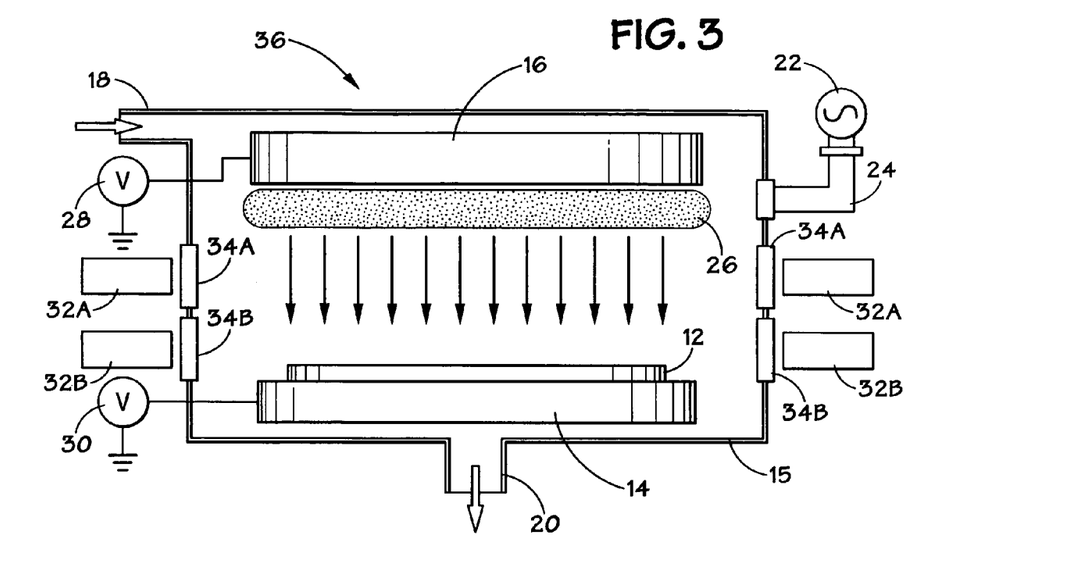
FIG. 3 illustrates a schematic view of a second embodiment of a deposition apparatus in accordance with the present invention.

In this first embodiment shown in FIG. 1, a collimated stream is produced by re-ionizing the target atoms in a region between the plasma and the substrate 12, so that the DC field can accelerate the re-ionized target atoms created by secondary ionizer 32 in a direction perpendicular to the surface of substrate 12. However, the longer a target atom can be kept ionized the greater steering capability is provided. Thus, as second embodiment of a sputtering apparatus 36 is illustrated in FIG. 3 as having multiple levels of secondary ionizers. To prevent confusion, elements in FIG. 3 that are analogous to elements in FIG. 1 are identified with identical reference numerals and may be considered to operate in the manner described above.

In regard to the multiple levels of secondary ionization, FIG. 3 illustrates two secondary ionizers 32A and 32B which are provided to increase the amount of time that each target atom remains ionized. As the plasma in the region 26 extracts target particles from the target 12, they may or may not be initially ionized in plasma as described above. Atoms having sufficient momentum pass out of plasma with non-collimated or isotropic trajectories. The first secondary ionizer 32A operating through the window 34A ionizes the target atoms as they intersect the path of ionizer's tuned optical energy. These selectively ionized target atoms are accelerated in a direction perpendicular to the substrate 12 by the DC field created by bias supply 30, while the unselected atoms remain neutral and unaffected by the DC field. To ensure that the target atoms remain ionized so that the DC field can continue to accelerate them in a collimated stream toward the substrate 12, the target atoms are once again ionized by the secondary ionizer 32B operating through the window 34B. Once the target atoms are selectively ionized again, the DC field created by bias supply 30 can further accelerate and provide greater lateral momentum to the target atoms.

Although two secondary ionizers 32A and 32B are shown in FIG. 3, it should be understood that any suitable number of secondary ionizers may be provided in a practical apparatus. Due to the relatively short lifetime of metal ions, it is believed that several levels of secondary ionization in the travel path between the plasma and the substrate 12 may be appropriate and desirable to provide improved directionality to particles. The remaining embodiments described below do not show multiple secondary ionizers, however it should be understood that multiple secondary ionizers may be incorporated with any of the variations described below.

Figure 4:
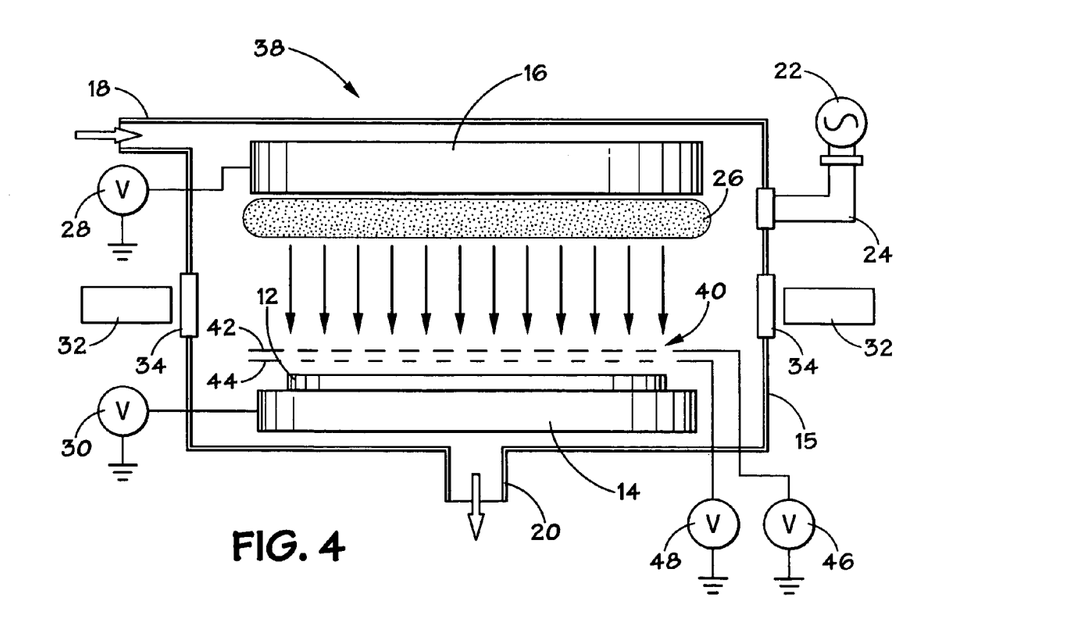
FIG. 4 illustrates a schematic view of a third embodiment of a deposition apparatus in accordance with the present invention.

FIG. 4 illustrates a third embodiment of a sputtering apparatus 38. Again, to prevent confusion, elements in FIG. 4 that are analogous to elements in FIG. 1 are identified with identical reference numerals and may be considered to operate in the manner described above. In the embodiments shown in FIGS. 1 and 3, collimation was provided by a DC field created between the plasma and the substrate 12. As discussed above, lattice-shaped collimator structures are known and used in connection with sputtering devices to improve collimation of particle streams. Of course, such collimators are mechanical devices that physically block particles having unacceptable trajectories. This physical blocking typically results in reduced deposition rate and particulate contamination within the sputter chamber.

Although a conventional lattice-type collimator may be used, particularly if the deposited atoms are steered to minimize deposition on the collimator, the embodiment shown in FIG. 4 advantageously employs an electrostatic collimator 40 instead. The electrostatic collimator 40 includes grids 42 and 44 that are differentially charged to opposite polarities by respective power supplies 46 and 48. Voltage outputs of the power supplies 46 and 48 are set to attract and accelerate target ions as they move through the collimator 40 in a manner that focuses their trajectories toward the substrate 12.

The electrostatic collimator 40 may be formed as a mesh, screen, or a sheet of conductive material having holes of any size or shape formed therein. Advantageously, the openings in the electrostatic collimator 40 are large compared to the surface area that is blocked by electrostatic collimator 40. Given such a structure, most of the ionized atoms will tend to pass through the electrostatic collimator 40 except for a small percentage of atoms that deposit on collimator 40.

Alternatively, a conventional lattice-type collimating structure can be provided using a conductive material. The lattice-type structure provided may exhibit the advantages of a conventional collimator in that a high degree of collimation is provided by the high aspect ratio of the openings. However, to the extent that the random trajectories of the target atoms have not been redirected towards the substrate 12 by the secondary ionizer 32, the conventional lattice-type collimator will tend to accumulate more target atoms than the electrostatic collimator 40. Specifically, by coupling a charge to the electrostatic grid collimator 40, the ionized target particles are steered through the collimator 40 rather than simply blocked as with a lattice-type collimator. This results in a higher degree of material passing through the electrostatic collimator 40 to provide improved deposition rates and reduced particulate deposition on the collimator.

Figure 5:
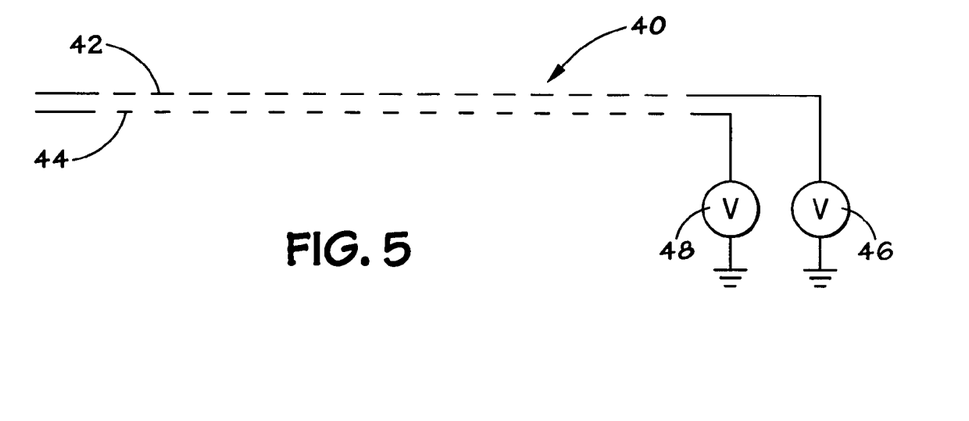
FIG. 5 illustrates a schematic side view of the electrostatic collimator illustrated in FIG. 4.
Figure 6:
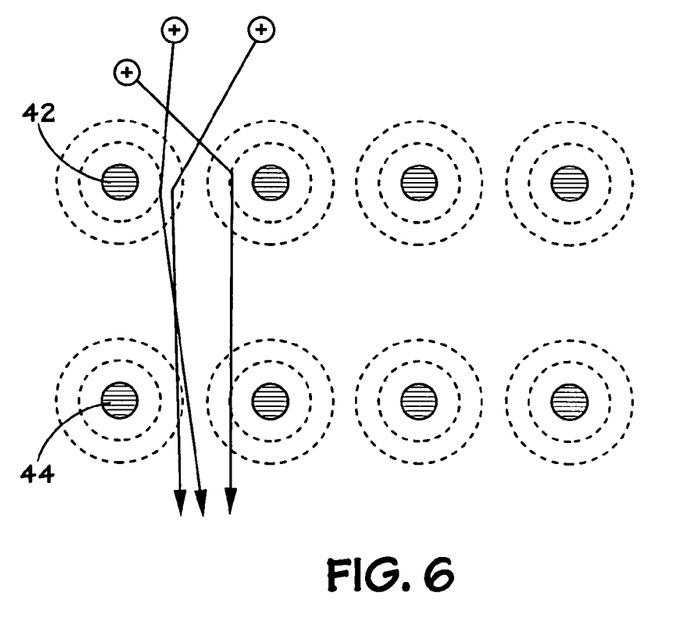
FIG. 6 illustrates a schematic cross-sectional view of the electrostatic collimator illustrated in FIG. 5.

FIGS. 5 and 6 illustrate details of the electrostatic collimator 40. FIG. 6 shows a cross-sectional view of the collimator 40 taken orthogonally from the view shown in FIG. 5. Field lines illustrated by the dashed circles in FIG. 6 represent equipotential surfaces in the electrostatic field created by the voltage supplied to electrostatic collimator grids 42 and 44 by the voltage supplies 46 and 48. It should be understood that the equipotential surfaces shown in FIG. 6 are greatly simplified yet are suitable for the purposes of this description. The actual field shapes will be more complex due to interaction between the grids 42 and 44.

In the case of accelerating positive target ions, a negative high voltage, typically in the range of 500 to 5000 volts DC, is supplied by the voltage supply 48 and applied to the grid 44. This acts to attract the positive ions toward the grid 44 with high velocity. A relatively low negative voltage, typically in the range of 50 to 500 volts DC, is supplied by the voltage supply 46 simultaneously to the grid 42. The positive ions do not respond to the voltage on the grid 42 until they have already been drawn very near to the grid 42 by the higher negative voltage applied to the grid 44. As positive ions near the grid 42, the positive ions are repulsed and deflected toward a center axis between the adjacent elements of the grid 42. This deflection effectively steers the ions through the collimator 40 and prevents the ions from physical contact with and deposition on grids 42 and 44. In essence, the grid 42 focuses the ions and the grid 44 accelerates the ions toward the substrate 12. The velocity and directionality is achieved by fine tuning the relative voltages between applied to the grids 42 and 44, and the shape and design of the holes in the grids 42 and 44 may also be varied to increase ion flux and/or increase the ion focusing properties.

While the electrostatic grid collimator 40 is described in conjunction with secondary ionization, it should be understood that electrostatic collimation without secondary ionization may also be useful. Particles sputtered from the target 16 have some inherent level of ionization caused by the sputter process, so the electrostatic collimator 40 will collimate the sputtered ions even where secondary ionization is not supplied. However, without the tuned secondary ionizer 32 which selectively ionizes the target particles without ionizing undesirable particles, using the electrostatic collimator 40 alone would provide the same undesirable affects of bombarding the substrate the argon ions, for instance.

Figure 7:
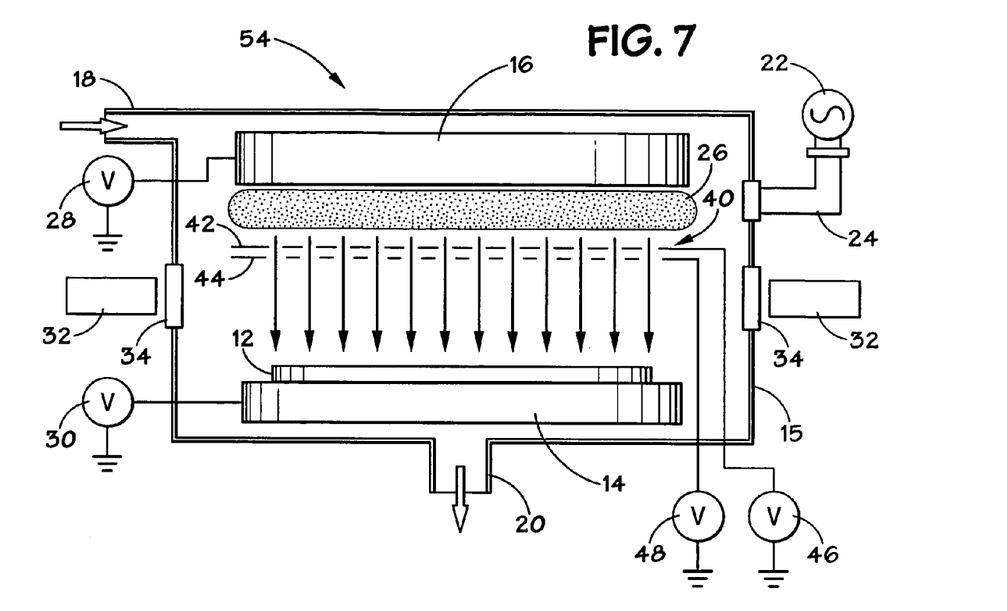
FIG. 7 illustrates a schematic view of a fourth embodiment of a deposition apparatus in accordance with the present invention.

Additionally, the electrostatic collimator 40 may be positioned between the plasma and the secondary ionization zone created by secondary ionizer 32, as demonstrated by the apparatus 54 illustrated in FIG. 7. In this fourth embodiment, ionized target atoms in the plasma are extracted from the region 26 by the physical momentum created by the plasma. The electrostatic collimator 40 is provided with a bias which steers and collimates the ions before they recombine to form neutral particles. Hence, the particles exiting the electrostatic collimator 40 are initially collimated as they enter the secondary ionization zone created by the secondary ionizer 32. The secondary ionization zone, as in the other embodiments, ionizes or re-ionizes the target particles while leaving other particles unaffected. Thus, the re-ionized target atoms are further laterally accelerated and collimated by the bias supply 30 toward the substrate 12.

Figure 8:
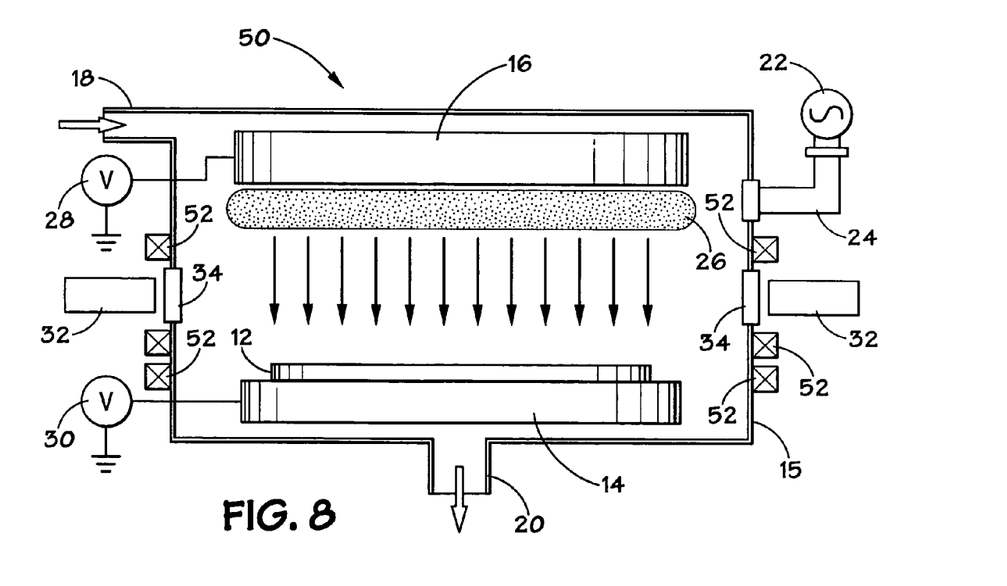
FIG. 8 illustrates a schematic view of a fifth embodiment of a deposition apparatus in accordance with the present invention.

FIG. 8 illustrates a fifth embodiment of a sputtering apparatus 50. As above, to prevent confusion, elements in FIG. 8 that are analogous to elements in FIG. 1 are identified with identical reference numerals and may be considered to operate in the manner described above. In the fifth embodiment, collimation is provided by a combination of DC electrostatic field and a static magnetic field provided by the coils 52. The coils 52 are wrapped about the deposition chamber to form a solenoid. A DC current is passed through coils 52 to create a static magnetic field having field lines longitudinally aligned between the plasma in the region 26 and the substrate 12. Although a magnetic field cannot influence neutral atoms, the addition of the secondary ionizer 32 operating through the window 34 selectively ionizes the target particles without ionizing other particles within the static magnetic field created by coils 52. The longitudinal force lines of the static magnetic field apply a longitudinal momentum to the ionized target atoms to create a collimated stream between the plasma and the substrate 12, while the neutrally charged argon atoms, for instance, are not affected by the magnetic field.

Figure 9:
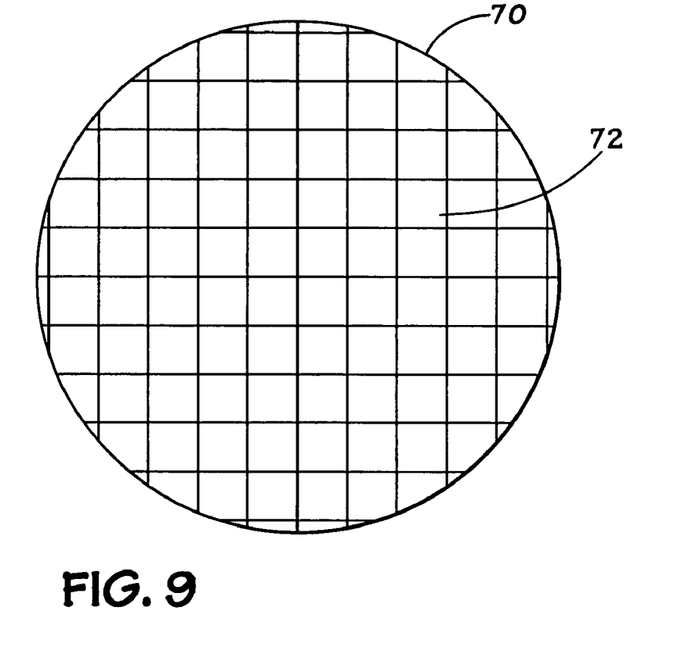
FIG. 9 illustrates a semiconductor wafer and its constituent die regions.

A typical semiconductor wafer which may be processed by the apparatus described above is illustrated in FIG. 9 and designated by a reference numeral 70. The wafer 70 includes a number of different regions, known as die regions 72. Each die region 72 may include an integrated circuit containing various features and fabricated using various materials and processes. For the purposes of this discussion, one of the die regions 72 will be discussed.

Figure 10:
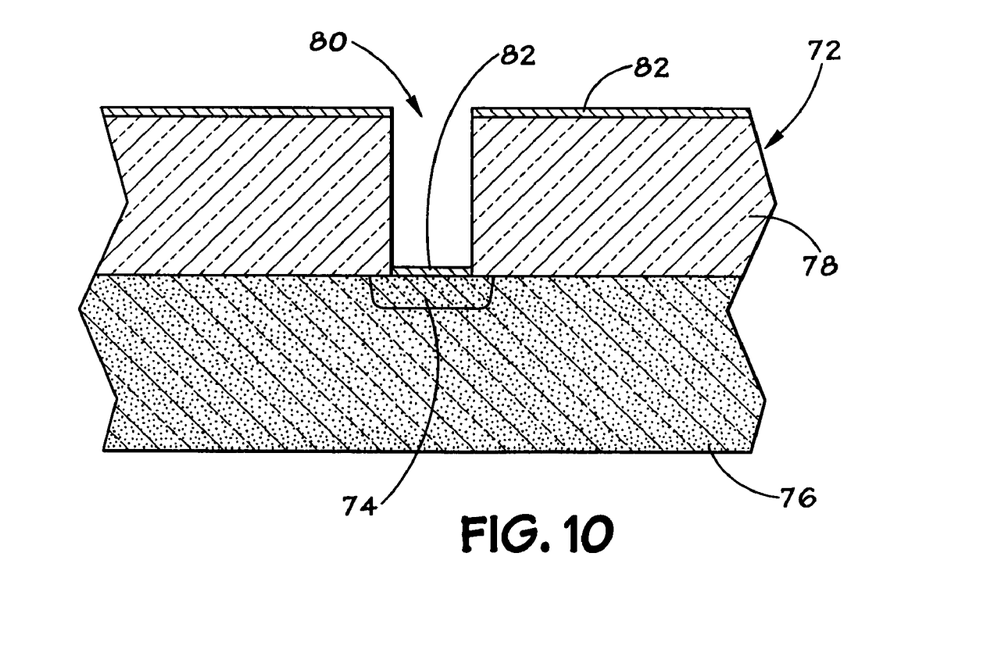
FIG. 10 illustrates a diagrammatic cross-section of a semiconductor wafer processed in accordance with the present invention, wherein a thin film has been deposited onto the surface of a die including the bottom of a contact opening.

The die region 72 includes a thin titanium-containing film. An example of such a film is illustrated in FIG. 10. Specifically, FIG. 10 illustrates a cross-sectional view of the die region 72 which includes an enhanced doped region or active region 74 within a semiconductor substrate 76. The active region 74 by be formed by an implantation process, for instance. The bulk substrate 76 is coated with an insulative layer 78, such as borophosphosilicate glass (BPSG) or phosphosilicate glass (PSG). The insulative layer 78 is etched to form a contact opening 80 through the insulative layer 78 to the active region 74. Of course it should be understood that the depiction of a contact opening to an active region is merely exemplary of a high-aspect ratio feature and that this discussion applies to other high-aspect ratio features, such as trenches and vias, as well.

Using the methods and apparatus described in detail above, a layer of titanium or titanium-containing film 82 is deposited across the wafer such that it covers the bottom of the contact opening 80. It should be noted that little of the film 82 is deposited on the sidewalls of the contact opening 80 due to the excellent directionality imparted to the target particles by the apparatus described above. Furthermore, it should be noted that the die region 72 has not been damaged by bombardment of undesirable argon ions due to the selectivity of the secondary ionizer 32 described above.

Figures 11, 12:
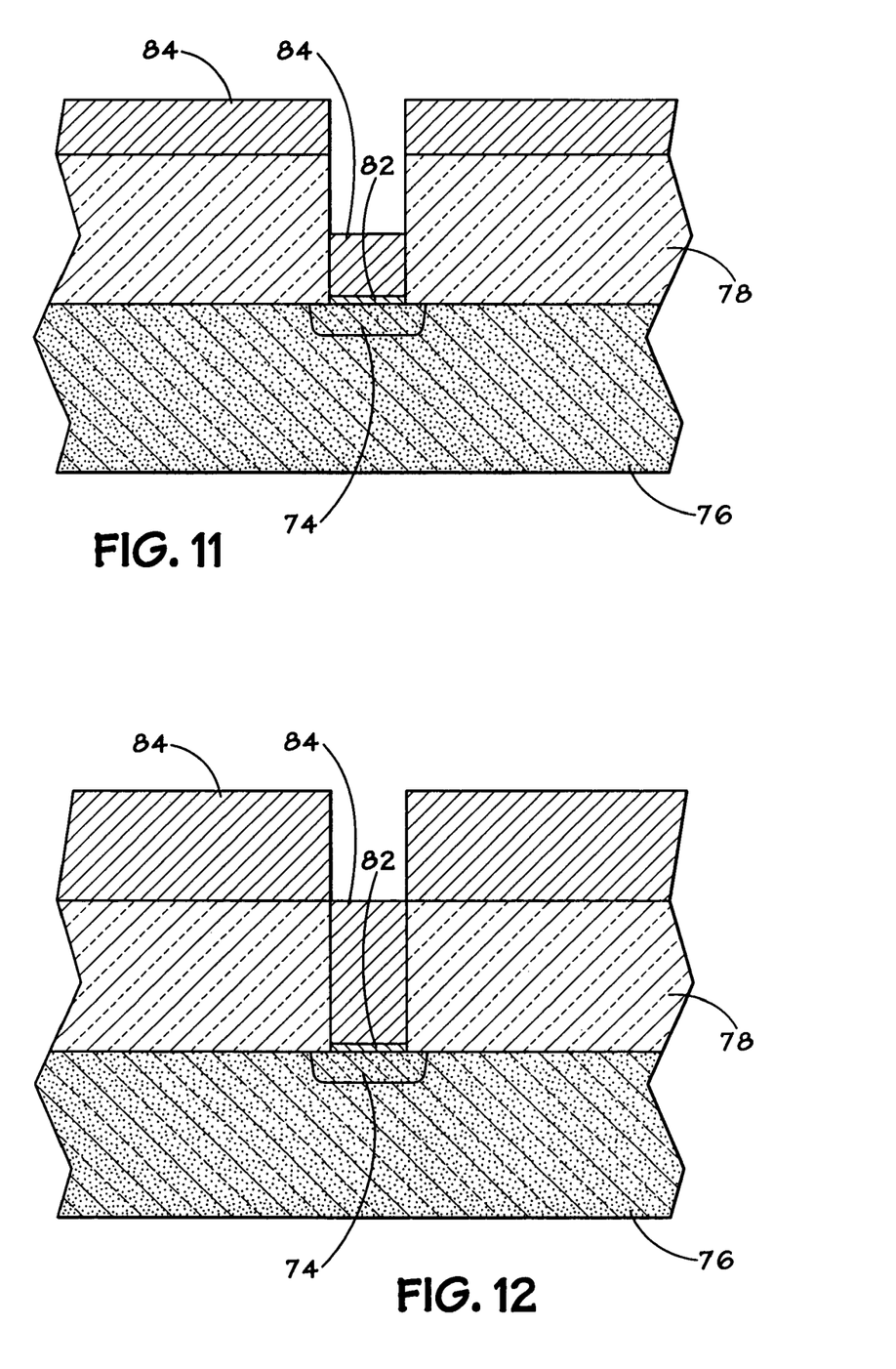
FIG. 11 illustrates a diagrammatic cross-section of a semiconductor wafer processed in accordance with the present invention, wherein a conductive layer has been deposited over the thin film to fill the contact opening partially.
FIG. 12 illustrates a diagrammatic cross-section of a semiconductor wafer processed in accordance with the present invention, wherein a conductive layer has been deposited over the thin film to fill the contact opening completely.

The thin film 82 advantageously exhibits good adhesion to the contact opening 80 and the active region 74, along with good adhesion to a subsequently deposited conductive metal layer 84 illustrated in FIGS. 11 and 12. The metal layer 84 may be titanium, for example, which is deposited in essentially the same manner as the thin film 82. Of course, the manner in which the selectivity of the secondary ionizer 32 is tuned may differ due to differences in particulate composition between the thin film 82 and the metal layer 84. As illustrated by the partially filled contact opening 80 in FIG. 11, little of the metal layer 84 is deposited on the sidewalls of the contact opening 80 due to the excellent directionality imparted to the target particles by the apparatus described above. Thus, as illustrated in FIG. 12, the metal layer 84 may completely fill the contact opening 80 without the creation of undesirable voids or seams.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus for depositing film on a substrate, the apparatus comprising:
    a deposition chamber adapted to hold target particles and other particles;
    an ionizer adapted to create an ionization zone to selectively ionize the target particles passing through the ionization zone while leaving the other particles passing through the ionization zone substantially unaffected; and
    an electrostatic collimator adapted to electrically steer the ionized target particles through the electrostatic collimator and toward the substrate.

2. The apparatus, as set forth in claim 1, wherein the deposition chamber comprises a support for holding a source of the target particles.

3. The apparatus, as set forth in claim 1, wherein the deposition chamber comprises a support for holding the substrate.

4. The apparatus, as set forth in claim 3, wherein the substrate comprises a semiconductor wafer.

5. The apparatus, as set forth in claim 1, comprising:
    a plasma generator creating a plasma within the deposition chamber to initially ionize the target particles.

6. The apparatus, as set forth in claim 5, wherein the ionization zone is separated from the plasma by a recombination zone in which the initially ionized target particles de-ionize prior to being re-ionized in the ionization zone.

7. The apparatus, as set forth in claim 1, wherein the ionizer comprises a laser having a wavelength and power chosen to ionize the target particles in preference to the other particles.

8. The apparatus, as set forth in claim 7, wherein the laser comprises one of an excimer laser and an EUV laser.

9. The apparatus, as set forth in claim 1, wherein the target particles comprise titanium-containing particles.

10. The apparatus, as set forth in claim 1, comprising:
    a static field generator creating an static field within the deposition chamber to accelerate the ionized target particles along a given trajectory toward the substrate.

11. The apparatus, as set forth in claim 1, wherein the deposition chamber comprises a mirrored inner surface.

12. The apparatus, as set forth in claim 11, wherein the ionizer comprises a laser arranged to direct optical energy onto the mirrored inner surface of the deposition chamber, the mirrored inner surface creating a plane of optical energy.

13. The apparatus, as set forth in claim 1, wherein the ionizer comprises a plasma generator.

14. The apparatus, as set forth in claim 1, wherein the ionizer comprises a microwave generator.

15. The apparatus, as set forth in claim 1, wherein the target particles comprise a refractory metal.

16. The apparatus, as set forth in claim 1, comprising at least one secondary ionizer adapted to create at least one secondary ionization zone, the at least one secondary ionizer adapted to promote ionization of the target particles as the target particles pass through the at least one secondary ionization zone while leaving the other particles substantially unaffected as the other particles pass through the at least one secondary ionization zone.

17. The apparatus, as set forth in claim 1, wherein the electrostatic collimator comprises:
    a first conductive grid;
    a first DC voltage source having a polarity matching that of the ionized target particles coupled to the first conductive grid;
    a second conductive grid placed adjacent the first conductive grid; and
    a second DC voltage source having a polarity opposite that of the ionized target particles coupled to the second conductive grid.

18. An apparatus for depositing a film on a substrate, the apparatus comprising:
    a deposition chamber adapted to contain inert particles, target particles, and a substrate, wherein the target particles comprise titanium-containing particles;
    a plurality of ionizers creating a plurality of ionization zones within the deposition chamber, each of the plurality of ionizers ionizing the target particles as they pass through each of the respective ionization zones while leaving the inert particles substantially unaffected; and
    a field generator creating a field within the deposition chamber to accelerate the ionized target particles generally along a given trajectory to the substrate.

19. The apparatus, as set forth in claim 18, wherein the deposition chamber comprises a support for holding a source of the target particles.

20. The apparatus, as set forth in claim 18, wherein the deposition chamber comprises a support for holding the substrate.

21. The apparatus, as set forth in claim 18, wherein the substrate comprises a semiconductor wafer.

22. The apparatus, as set forth in claim 18, wherein the deposition chamber comprises a port for entry of the inert particles.

23. The apparatus, as set forth in claim 18, comprising:
  a plasma generator creating a plasma within the deposition chamber to initially ionize the target particles.

24. The apparatus, as set forth in claim 23, wherein the plurality of ionization zones are separated from the plasma by a recombination zone in which the initially ionized target particles de-ionize prior to being re-ionized in the plurality of ionization zones.

25. The apparatus, as set forth in claim 18, wherein each of the plurality of ionizers comprises:
  an optical ionizer adapted to create a plane of optical energy within the deposition chamber, the optical energy selectively ionizing the target particles passing through the plane while leaving the inert particles passing through the plane substantially unaffected.

26. The apparatus, as set forth in claim 18, wherein each of the plurality of ionizers comprises a laser having a wavelength and power chosen to ionize the target particles in preference to the inert particles.

27. The apparatus, as set forth in claim 26, wherein the laser comprises one of an excimer laser and an EUV laser.

28. The apparatus, as set forth in claim 18, wherein the target particles comprise a refractory metal.

29. The apparatus, as set forth in claim 18, wherein the field generator comprises:
  an electrostatic field generator adapted to create an electrostatic field to accelerate the ionized target particles along a substantially collimated trajectory toward the substrate.

30. The apparatus, as set forth in claim 18, wherein the field generator comprises:
  a magnetic field generator adapted to create a magnetic field to accelerate the ionized target particles along a substantially collimated trajectory toward the substrate.

31. The apparatus, as set forth in claim 18 wherein each of the plurality of ionizers comprises a plasma generator.

32. The apparatus, as set forth in claim 18, wherein each of the plurality of ionizers comprises a microwave generator.

33. The apparatus, as set forth in claim 18, comprising an electrostatic collimator adapted to electrically steer the ionized target particles toward the substrate.

34. The apparatus, as set forth in claim 33, wherein the electrostatic collimator comprises:
  a first conductive grid;
  a first DC voltage source having a polarity matching that of the ionized target particles coupled to the first conductive grid;
  a second conductive grid placed adjacent the first conductive grid; and
  a second DC voltage source having a polarity opposite that of the ionized target particles coupled to the second conductive grid.

35. A method of manufacturing an integrate circuit, comprising the acts of:
  passing target particles and inert particles through at least one ionization zone in a deposition chamber to ionize the target particles while leaving the inert particles substantially unaffected; and
  steering the ionized target particles into a collimated stream directed along a given path toward the substrate using an electrostatic collimator.

36. The method, as set forth in claim 35, wherein the act of steering comprises the acts of:
  using a first grid of the electrostatic collimator to attract the ionized target particles; and
  using a second grid of the electrostatic collimator to direct the ionized target particles through the electrostatic collimator.

37. The method, as set forth in claim 35, wherein the act of steering comprises the act of charging the substrate to attract the ionized target particles passing through the electrostatic collimator.

38. The method, as set forth in claim 35, wherein the act of passing comprises the act of passing target particles comprising a refractory metal through the at least one ionization zone.

39. The method, as set forth in claim 35, wherein the act of passing comprises the act of passing target particles comprising titanium-containing particles through the at least one ionization zone.

40. The method, as set forth in claim 35, wherein the act of passing comprises the act of passing the target particles and the inert particles through a plurality of ionization zones.

* * * * *